US012660616B2

(12) United States Patent
Hsieh et al.

(10) Patent No.: US 12,660,616 B2
(45) Date of Patent: Jun. 16, 2026

(54) LID STRUCTURE WITH OPENINGS TO ALLEVIATE LEAKAGE OF THERMAL INTERFACE MATERIAL OF A CHIP ASSEMBLY

(71) Applicant: Taiwan Semiconductor Manufacturing Company, Ltd., Hsin-Chu (TW)

(72) Inventors: Ping-Yin Hsieh, Hsinchu city (TW); Li-Hui Cheng, New Taipei City (TW); Pu Wang, Hsinchu City (TW); Ying-Ching Shih, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 472 days.

(21) Appl. No.: 18/193,932

(22) Filed: Mar. 31, 2023

(65) Prior Publication Data

US 2024/0332113 A1 Oct. 3, 2024

(51) Int. Cl.
H10W 40/22 (2026.01)
H10B 80/00 (2026.01)
(Continued)

(52) U.S. Cl.
CPC ............ H10W 40/22 (2026.01); H10B 80/00 (2023.02); H10W 40/70 (2026.01);
(Continued)

(58) Field of Classification Search
CPC ... H01L 23/367; H01L 21/56; H01L 23/3128; H01L 23/42; H01L 23/5383; H01L 24/29;
(Continued)

(56) References Cited

U.S. PATENT DOCUMENTS

| | | | |
|---|---|---|---|
| 8,802,504 B1 | 8/2014 | Hou et al. | |
| 8,803,292 B2 | 8/2014 | Chen et al. | |

(Continued)

FOREIGN PATENT DOCUMENTS

| | | |
|---|---|---|
| TW | 200614468 A | 5/2006 |
| TW | 200616184 A | 5/2006 |
| TW | 202243151 A | 11/2022 |

*Primary Examiner* — Patricia D Valenzuela
(74) *Attorney, Agent, or Firm* — HAYNES AND BOONE, LLP

(57) ABSTRACT

An integrated circuit (IC) device includes a substrate, such as a printed circuit board (PCB) substrate. A chip assembly is disposed over the substrate. The chip assembly includes an IC, a plurality of electronic memory devices coupled to the IC, and a molding compound material that circumferentially surrounds the IC and the electronic memory devices collectively in a top view. A thermal interface material (TIM) is disposed over the chip assembly. The TIM includes an indium alloy, a gallium alloy, or an alloy that contains bismuth, indium, and tin. An adhesive dam is disposed over the substrate. The adhesive dam surrounds the chip assembly and the TIM laterally. A lid structure is disposed over the substrate and encapsulates the chip assembly therein. The lid structure includes one or more openings that expose portions of the TIM. The one or more openings accommodate an expansion of the TIM.

20 Claims, 21 Drawing Sheets

(51) Int. Cl.

| | |
|---|---|
| *H10W 40/70* | (2026.01) |
| *H10W 70/60* | (2026.01) |
| *H10W 70/685* | (2026.01) |
| *H10W 74/01* | (2026.01) |
| *H10W 74/10* | (2026.01) |
| *H10W 72/00* | (2026.01) |
| *H10W 72/30* | (2026.01) |
| *H10W 72/90* | (2026.01) |
| *H10W 90/00* | (2026.01) |

(52) U.S. Cl.

CPC ........ *H10W 70/611* (2026.01); *H10W 70/685* (2026.01); *H10W 74/01* (2026.01); *H10W 74/117* (2026.01); *H10W 72/07354* (2026.01); *H10W 72/347* (2026.01); *H10W 72/352* (2026.01); *H10W 72/387* (2026.01); *H10W 72/952* (2026.01); *H10W 90/734* (2026.01); *H10W 90/736* (2026.01)

(58) Field of Classification Search

CPC ......... H01L 24/32; H01L 24/33; H01L 24/83; H01L 2224/26175; H01L 2224/29105; H01L 2224/29109; H01L 2224/29111; H01L 2224/29113; H01L 2224/32225; H01L 2224/32245; H01L 2224/33181; H01L 2224/83439; H01L 2224/83444; H01L 2224/83447; H01L 2224/83455; H01L 23/3675; H10B 80/00; H10W 40/22; H10W 40/70; H10W 70/611; H10W 70/685; H10W 74/01; H10W 74/117; H10W 72/07354; H10W 72/347; H10W 72/352; H10W 72/387; H10W 72/952; H10W 90/734; H10W 90/736

See application file for complete search history.

(56) References Cited

U.S. PATENT DOCUMENTS

| | | | |
|---|---|---|---|
| 8,803,316 | B2 | 8/2014 | Lin et al. |
| 8,993,380 | B2 | 3/2015 | Hou et al. |
| 9,281,254 | B2 | 3/2016 | Yu et al. |
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,496,189 | B2 | 11/2016 | Yu et al. |
| 2019/0074261 | A1* | 3/2019 | Yu ........................... H01L 21/56 |
| 2022/0216129 | A1* | 7/2022 | Shen .................. H01L 23/3675 |

* cited by examiner

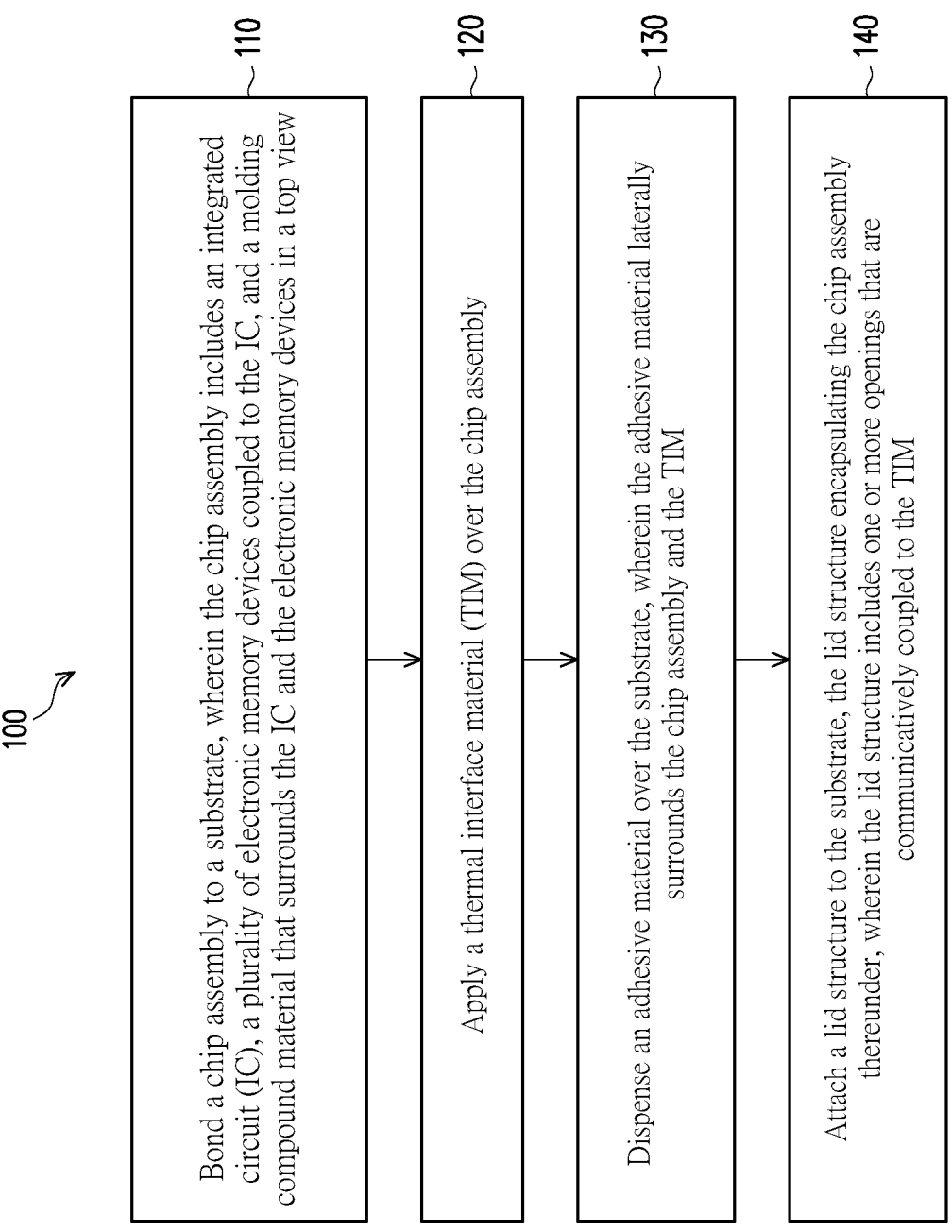

100

110 — Bond a chip assembly to a substrate, wherein the chip assembly includes an integrated circuit (IC), a plurality of electronic memory devices coupled to the IC, and a molding compound material that surrounds the IC and the electronic memory devices in a top view 120 — Apply a thermal interface material (TIM) over the chip assembly 130 — Dispense an adhesive material over the substrate, wherein the adhesive material laterally surrounds the chip assembly and the TIM 140 — Attach a lid structure to the substrate, the lid structure encapsulating the chip assembly thereunder, wherein the lid structure includes one or more openings that are communicatively coupled to the TIM

FIG. 1

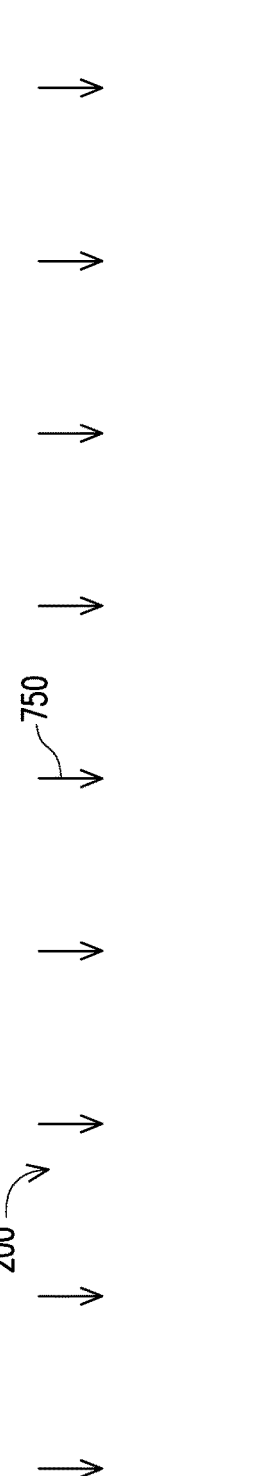
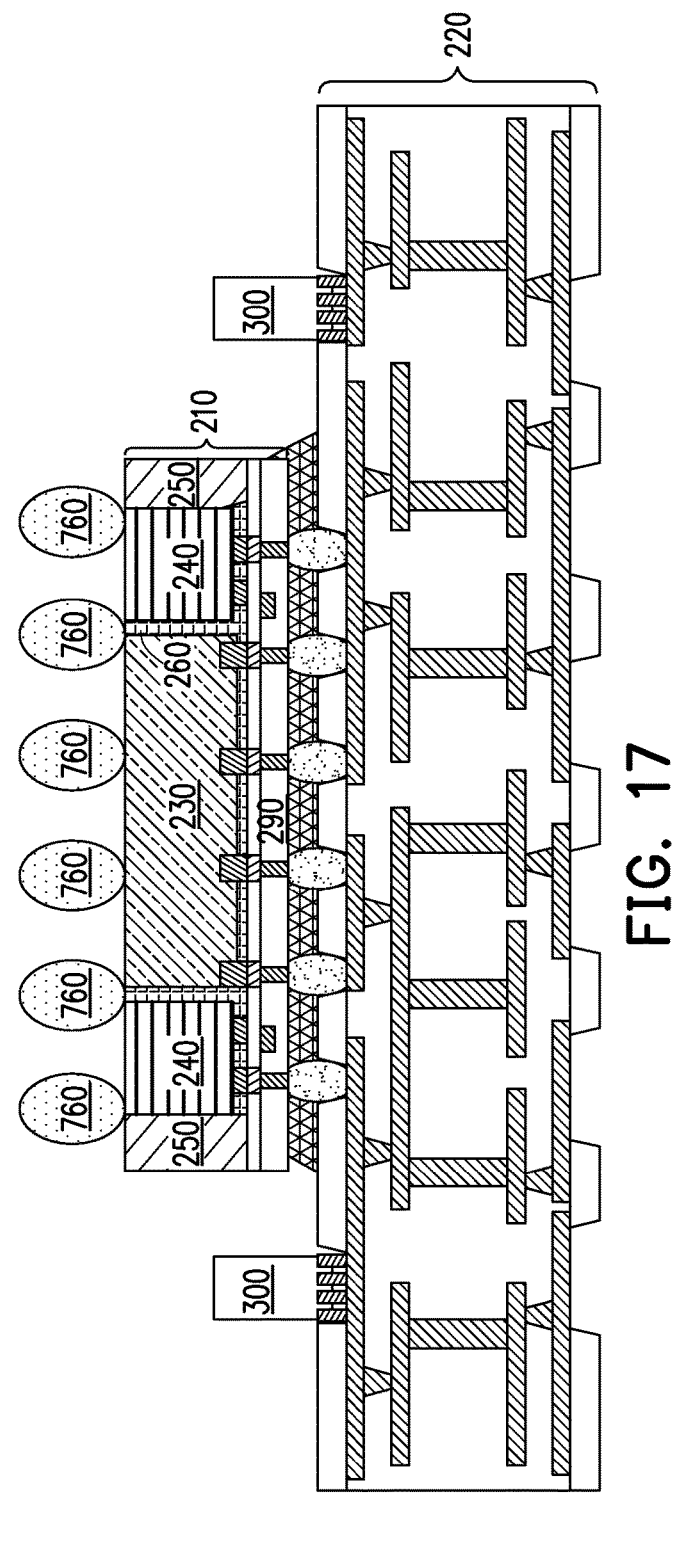
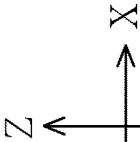
FIG. 17

LID STRUCTURE WITH OPENINGS TO ALLEVIATE LEAKAGE OF THERMAL INTERFACE MATERIAL OF A CHIP ASSEMBLY

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

However, as semiconductor fabrication progresses to more advanced technology nodes, additional fabrication challenges may arise. For example, an IC device may apply a thermal interface material (TIM) over a chip assembly to dissipate heat. However, under certain conditions, the TIM may expand and then leak onto adjacent components, such as resistors, capacitors, inductors, etc., which could lead to undesirable electrical shorting.

Therefore, although existing IC devices and their methods of fabrication have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

FIG. 1 is a flowchart illustrating a method of fabricating an IC device according to various aspects of the present disclosure.

FIGS. 11-20 illustrate a series of cross-sectional side views of an IC device at various stages of fabrication according to embodiments of the present disclosure.

DETAILED DESCRIPTION

Figure 2:
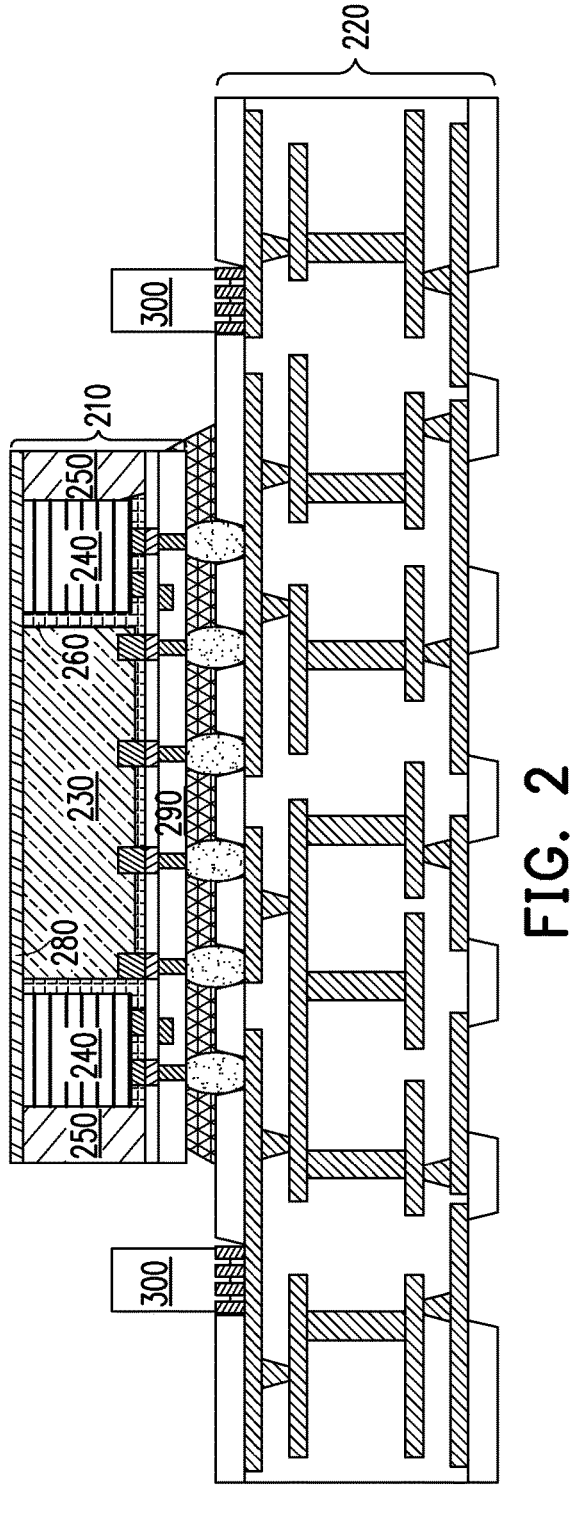
FIGS. 2-7 illustrate a series of cross-sectional side views of an IC device at various stages of fabrication according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to a novel lid structure design to prevent or alleviate the potential problems caused by the leakage of a thermal interface material (TIM) of an IC device. In more detail, the TIM formed over a chip assembly may melt and/or otherwise undergo expansion in volume under certain conditions, such as when temperature exceeds a certain threshold. When this occurs, the TIM may leak out and come into contact with other microelectronic components. Even when dam structures (e.g., made of adhesive materials) are implemented to prevent such TIM leakage, they may not be sufficient to completely stop the leakage of the TIM material. Often times, the dam structures may be weakened by factors such as IC package warpage, or by an excessive amount of pressure created by hot air associated with the expansion of the TIM. When the leaked TIM comes into contact with other components, such as passive components, it may cause undesirable electrical shorting between these passive components and the circuitry inside the chip assembly, since the TIM may also be electrically coupled to the circuitry inside the chip assembly.

To address these issues, the present disclosure implements one or more openings (e.g., in the form of trenches or holes) in the lid structure. These openings are configured to accommodate the expanded TIM material, which alleviates the pressure against the dam structures. In other words, when the TIM undergoes expansion, the path of least resistance is to flow into the openings of the lid structure. In this manner, even if some portions of the TIM still press against the nearby dam structures, the amount of pressure is substantially smaller, which allows the dam structures to hold the leaked TIM in place without breaking. Accordingly, undesirable electrical shorting caused by the TIM leakage is substantially prevented or at least alleviated, thereby improving IC device yield and/or performance.

The various aspects of the present disclosure will now be discussed below with reference to FIGS. 1-21. In more detail, FIG. 1 illustrates a flowchart of a method of fabricating an IC device according to various aspects of the present disclosure. FIGS. 2-7, 9, and 11-20 illustrate cross-sectional side views of an IC device at various stages of fabrication according to embodiments of the present disclosure. FIGS. 8A and 10A illustrate top views of a portion of the IC device. FIGS. 8B and 10B illustrate cross-sectional views of a lid structure according to embodiments of the present disclosure. FIG. 21 illustrates a semiconductor fabrication system.

Referring now to FIG. 21, a flowchart illustrates a method 100 of fabricating a semiconductor device. The method 100 includes a step 110 to bond a chip assembly to a substrate. The chip assembly includes an integrated circuit (IC), a plurality of electronic memory devices coupled to the IC, and a molding compound material that surrounds the IC and the electronic memory devices in a top view.

The method 100 includes a step 120 to apply a thermal interface material (TIM) over the chip assembly.

The method 100 includes a step 130 to dispense an adhesive material over the substrate. The adhesive material laterally surrounds the chip assembly and the TIM.

The method 100 includes a step 140 to attach a lid structure to the substrate, the lid structure encapsulating the chip assembly thereunder. The lid structure includes one or more openings that are communicatively coupled to the TIM.

In some embodiments, the chip assembly includes one or more non-heat-generating regions. In some embodiments, the lid structure is attached such that the one or more openings are vertically aligned with the one or more non-heat-generating regions.

In some embodiments, the one or more openings include holes that extend through the lid structure vertically.

In some embodiments, the one or more openings include trenches that extend partially into the lid structure vertically.

In some embodiments, the applying the TIM comprises applying an alloy that contains bismuth, indium, and tin as the TIM. In some embodiments, the TIM is applied directly on an upper surface of the chip assembly. In some embodiments, the lid structure is attached directly to an upper surface of the TIM.

In some embodiments, the applying the TIM comprises a liquid metal dispensing process that dispenses a plurality of liquid metal components over the chip assembly. In some embodiments, the liquid metal components each contain a gallium alloy.

It is understood that additional steps may be performed before, during, or after the steps 110-140. For example, the method 100 may further include a step of: before the applying of the TIM, applying a first flux material over an upper surface of the chip assembly. As another example, the method 100 may further include a step of: after the applying of the TIM, applying a second flux material over the TIM.

In some embodiments, the applying the TIM comprises applying an indium-based material as the TIM over the first flux material.

The various aspects of the method 100 will now be discussed in more detail with reference to FIGS. 2-21. For example, FIGS. 2-7 illustrate diagrammatic fragmentary cross-sectional views of a portion of an IC device 200 (in which transistors such as FinFET or GAA devices are implemented) at various stages of fabrication according to various embodiments of the present disclosure. In more detail, FIGS. 2-7 illustrate the cross-sectional views along an X-Z plane, and as such, FIGS. 2-7 may be referred to as X-cuts.

As shown in FIG. 2, the IC device 200 includes a chip assembly 210 and a substrate 220 that is coupled to the chip assembly 210. The chip assembly 210 include an IC 230 and a plurality of electronic memory devices 240 that are electrically coupled to the IC 230. The IC 230 may include microelectronic circuitry formed by transistors, for example, FinFET devices and/or the GAA devices. The electronic memory devices 240 may include static random access memory (SRAM) devices, dynamic random access memory (DRAM) devices, or combinations thereof. In some embodiments, the electronic memory devices 240 may be electronically coupled to the IC 230 through a high bandwidth memory (HBM) interface. In some embodiments, the electronic memory devices 240 are disposed around the IC 230 in a top view, as will be discussed in more detail below with reference to FIG. 8A.

Still referring to FIG. 2, the IC 230 and the electronic memory devices 240 generate heat during their operations. As such, the IC 230 and the electronic memory devices 240 may be referred to as heat-generating regions of the chip assembly 210. The chip assembly 210 also includes a plurality of non-heat-generating regions. For example, the non-heat-generating regions of the chip assembly 210 include a molding compound 250, which may include an organic material, such as an epoxy-based material. The molding compound 250 may circumferentially surround the IC 230 and the electronic memory devices 240 collectively in the top view of FIG. 8A. In the cross-sectional side view of FIG. 2, the molding compound 250 is illustrated as being located besides the electronic memory devices 240 at the edges of the chip assembly 210.

As another example, the non-heat-generating regions of the chip assembly 210 may include an underfill material 260. Portions of the underfill material 260 may be disposed between the IC 230 and the electronic memory devices 240. Portions of the underfill material 260 may also be disposed below the IC 230 and the electronic memory devices 240. The underfill material 260 may also include an organic material, such as an epoxy-based material. In some embodiments, the molding compound 250 and the underfill material 260 may have different material compositions. In some other embodiments, the molding compound 250 and the underfill material 260 may have the same material composition. Regardless of their specific material compositions, it is understood that the molding compound 250 and the underfill material 260 do not generate heat during the operation of the IC device 200. Hence, the molding compound 250 and the underfill material 260 may be collectively referred to as non-heat-generating regions of the IC device 200.

In some embodiments, a back side metal layer 280 may be optionally formed over an upper surface of the chip assembly 210. The back side metal layer 280 may also be considered a part of the chip assembly 210. In some embodiments, the back side metal layer 280 may include a plurality of layers, for example, an adhesion layer, a diffusion block-ing layer, an anti-oxidation layer (e.g., containing gold), etc.

Still referring to FIG. 2, the substrate 220 that is coupled to the chip assembly 210 may include a printed circuit board (PCB) substrate in some embodiments. For example, the PCB substrate 220 may include a plurality of layers that are each configured to route electrical signals. The PCB sub-strate 220 may include a plurality of metal lines in each of the layers, as well as vias that interconnect the metal lines from different layers. The PCB substrate 220 may also include a dielectric material that provides electrical and physical isolation for the metal lines and vias. In some embodiments, the IC 230 and the electronic memory devices 240 are bonded to the PCB substrate 220 through an interposer layer 290. The molding compound 250 and the underfill material 260 may be applied around the IC 230 and the electronic memory devices 240 after the bonding of the IC 230 and the electronic memory device 240 to the sub-strate 220. A curing process may also be applied to cure and harden the molding compound 250 and the underfill material 260. The metal lines and the vias of the substrate 220 provide further electrical routing for the circuitries of the chip assembly 210.

A plurality of passive circuit components 300 may also be placed on the upper surface of the substrate 220. In some embodiments, the passive circuit components 300 may include resistors, inductors, or capacitors. The passive cir-cuit components 300 are electrically coupled to the substrate 220, and by extension, to the desired circuitries inside the electronic memory devices 240 and/or the IC 230, in order to facilitate the proper operation or functioning of the chip assembly 210. However, in some situations, a thermal expansion of a thermal interface material (TIM) that is to be formed on the chip assembly 210 could cause the TIM to leak onto nearby components, such as onto the passive components 300. This will then lead to undesirable electrical shorting between the passive components 300 and the chip assembly 210, as will be described in further detail below. The present disclosure devises a solution to such a TIM leakage problem, as will also be discussed in more detail below.

Figure 3:
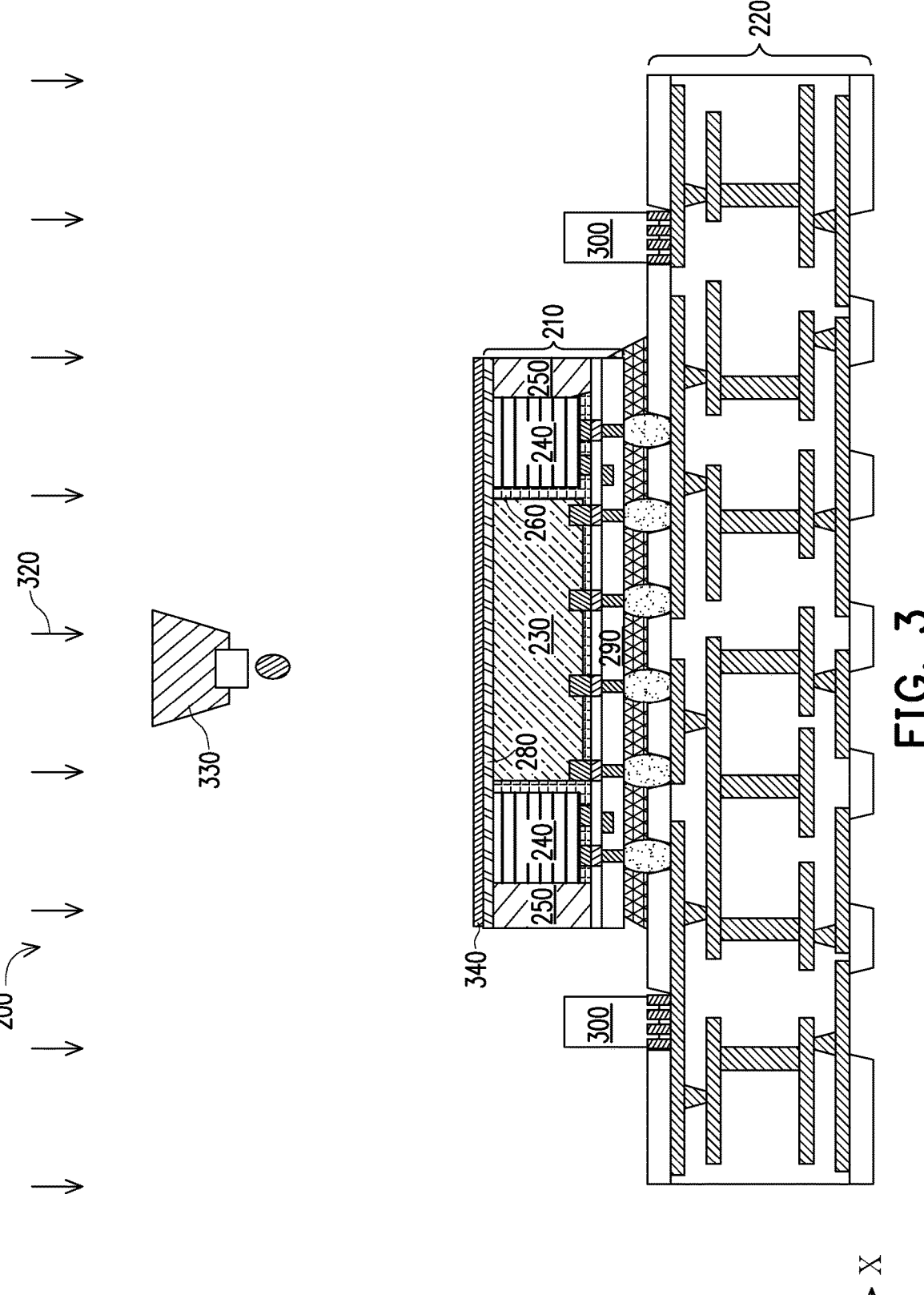

Referring now to FIG. 3, a flux jetting process 320 is applied to the IC device 200. For example, a nozzle 330 may be used to apply a flux material 340 over the chip assembly 210. In embodiments where the back side metal layer 280 is implemented, the flux material 340 is applied on the upper surface of the back side metal layer 280. The flux material 340 may facilitate soldering, brazing, and/or welding between the chip assembly 210 and layers to be formed thereover. The flux material 340 may also serve as a heat-transfer medium.

Figure 4:
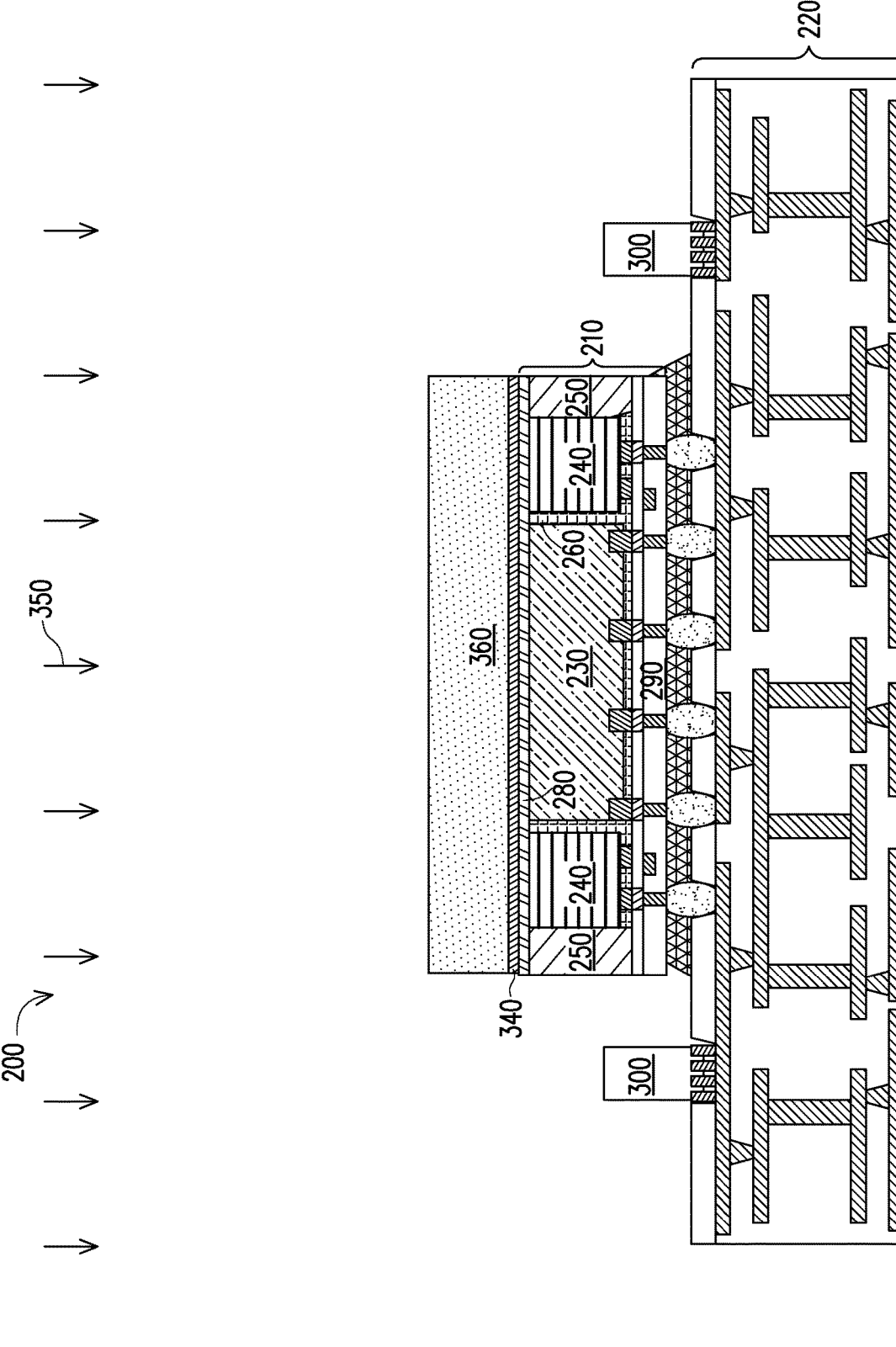

Referring now to FIG. 4, a TIM application process 350 is performed to the IC device 200 to form a TIM 360. In some embodiments, the TIM application process 350 may include a pick-and-place (PnP) process to apply indium or an indium-based alloy as the TIM 360 on the upper surface of the flux material 340. The flux material 340 facilitates the attachment between the TIM 360 and the chip assembly 210 below. The TIM 360 is a suitable candidate to help dissipate heat for the chip assembly 210.

Figure 5:
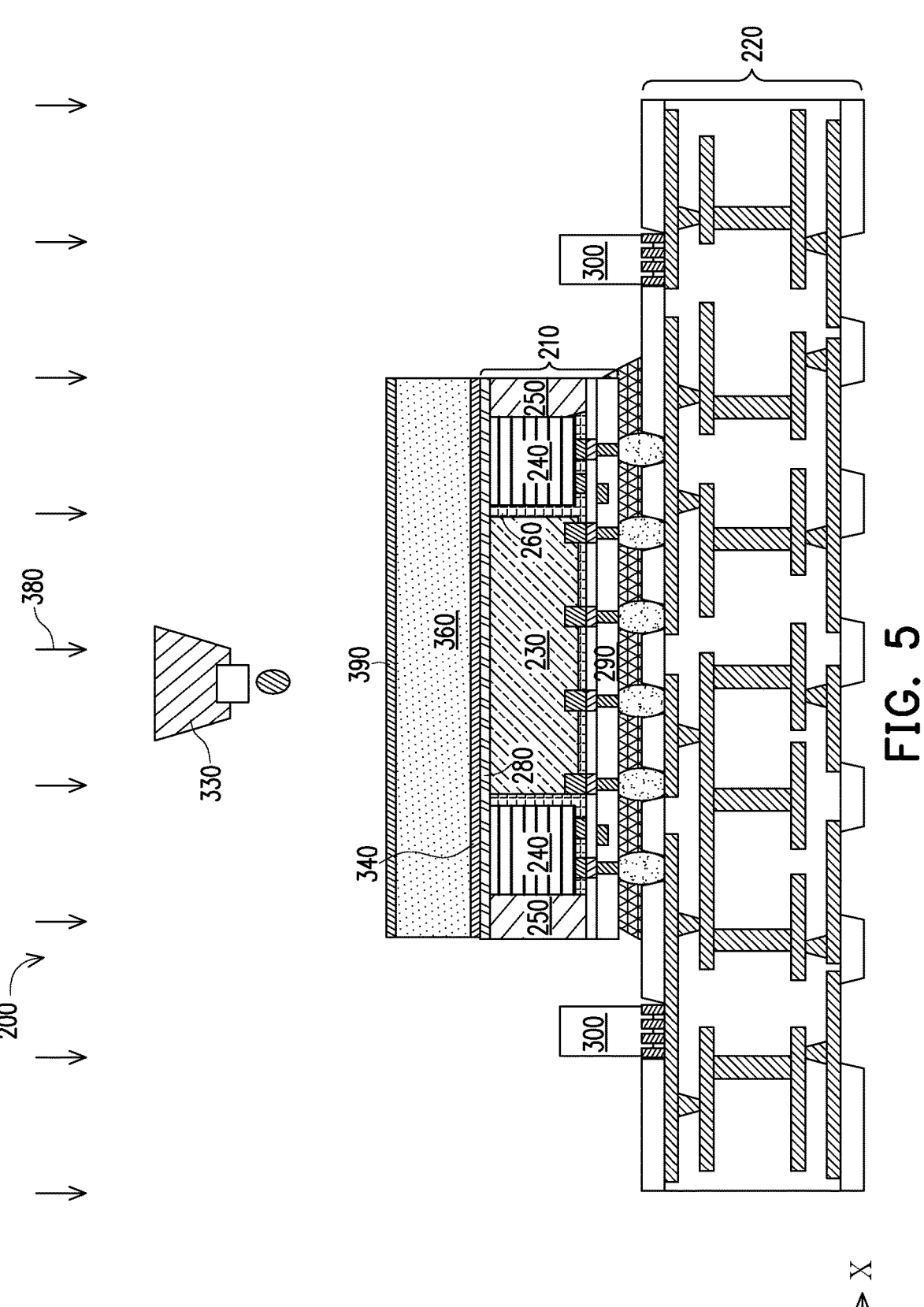

Referring now to FIG. 5, another flux jetting process 380 is applied to the IC device 200. For example, the nozzle 330 discussed above (used in the flux jetting process 320) may be used to apply a flux material 390 over the TIM 360. The flux material 340 may also facilitate soldering, brazing, and/or welding between the TIM 360 and layers to be formed thereover. The flux material 390 may also serve as a heat-transfer medium. In some embodiments, the flux mate-rial 390 may have a same material composition as the flux material 340.

Figure 6:
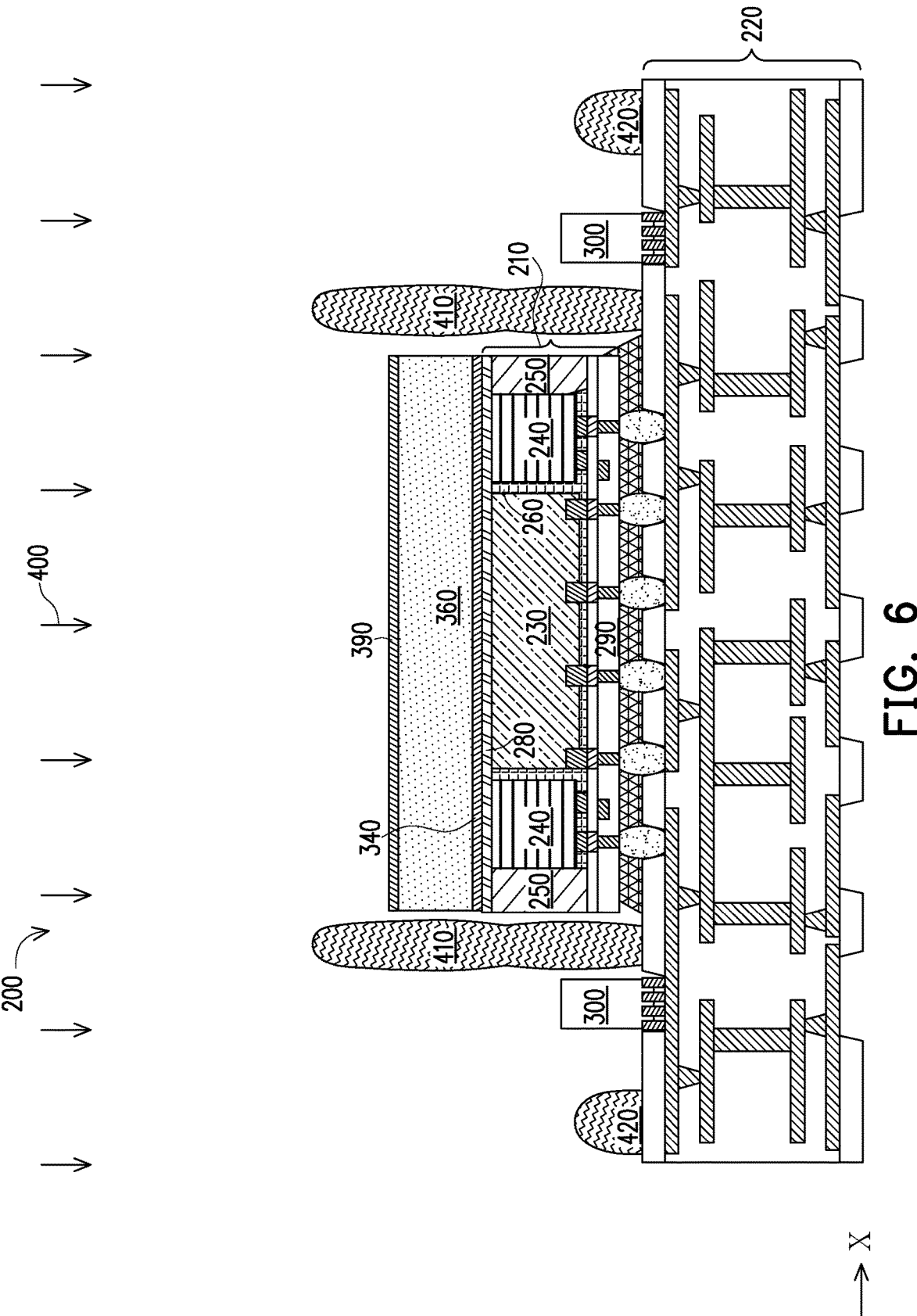

Referring now to FIG. 6, an adhesive dispensing process 400 is performed to form adhesive structures, such as adhesive structures 410 and 420, over the substrate 220. In more detail, the adhesive structures 410 are formed between the chip assembly 210 and the passive components 300. The adhesive structures 410 also have heights that exceed a combined height of the chip assembly 210, the TIM 360, and the flux materials 340 and 390. In this manner, the adhesive structures 410 may serve as adhesive dam structures to prevent or reduce the leakage of the TIM 360 onto the passive components 300. Meanwhile, the adhesive struc-tures 420 are formed farther away from the chip assembly 210 and have substantially shorter heights. The adhesive structures 420 may be used to attach a lid structure (in a later process) to the substrate 220. In some embodiments, the adhesive structures 410 and 420 may include a glue material.

Figure 7:
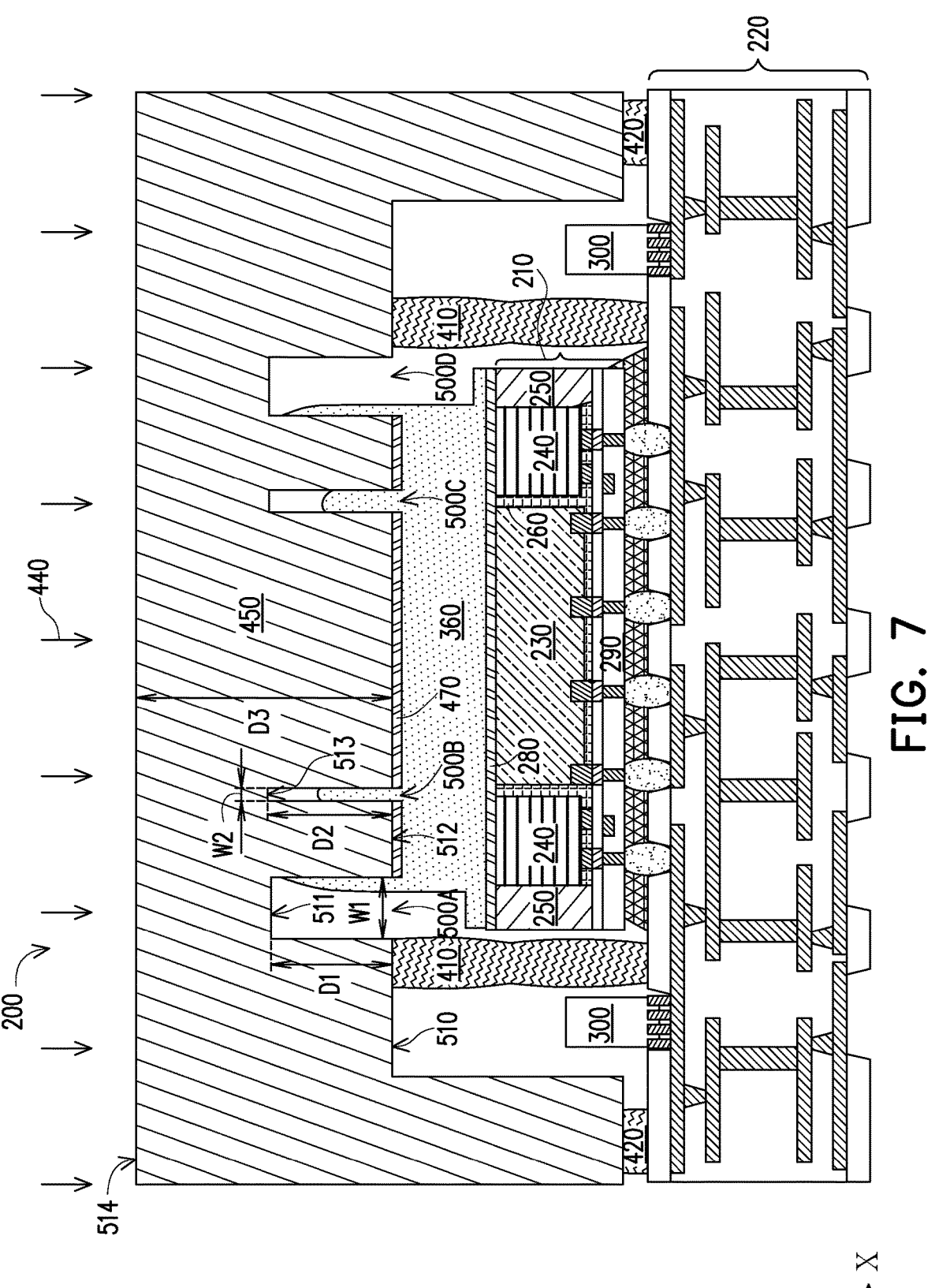
Figure 8B:
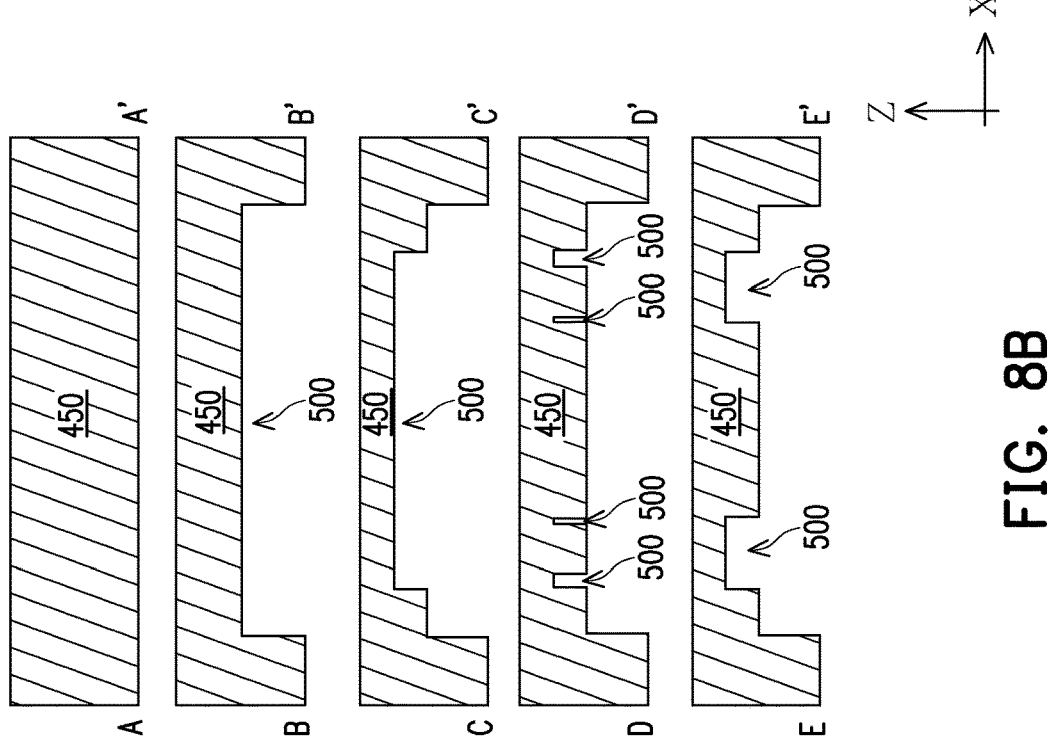
FIG. 8B illustrates various cross-sectional side views of a lid structure according to embodiments of the present disclosure.
Figure 8A:
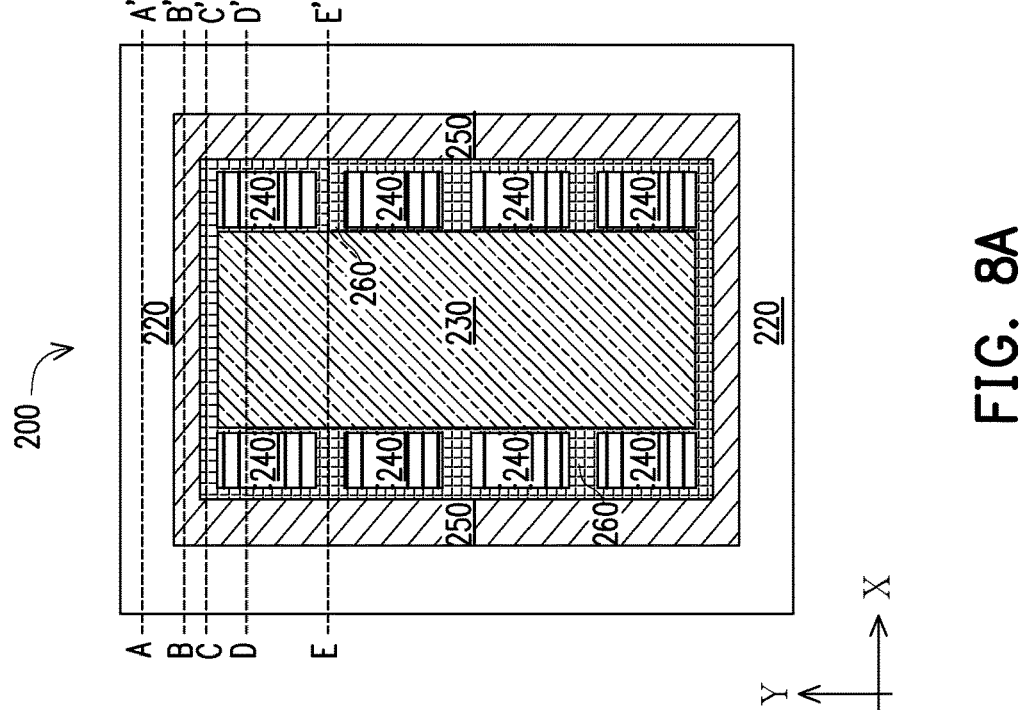
FIG. 8A illustrates a top view of an IC device according to embodiments of the present disclosure.

Referring now to FIG. 7, a lid attachment process 440 is performed to attach a lid structure 450 to the IC device 200 and to the substrate 220. In some embodiments, the lid structure 450 is a metallic structure. For example, the lid structure 450 may contain copper, nickel, gold, silver, or combinations thereof. Portions of the lid structure 450 are placed over the adhesive structures 410 and 420. As such, the lid structure 450, the substrate 220, and the adhesive structures 410 collectively encapsulate the chip assembly 210 therein. The lid structure 450 helps to protect the encapsulated chip assembly 210 from undesirable mechani-cal impact and from contaminants such as dust or moisture.

In some embodiments, a plating layer 470 is optionally formed over the TIM 360, and a portion of a bottom surface 512 of the lid structure 450 is formed directly on the plating layer 470. In other words, the lid structure 450 is attached to the chip assembly 210 at least in part through the TIM 360 and the plating layer 470. Note that in the embodiment shown in FIG. 7, the flux materials 340 and 390 are not specifically illustrated for reasons of simplicity. The flux material 390 may also be considered to be a part of TIM 360 at this stage of fabrication.

In other types of devices, various conditions may cause the TIM to leak during the manufacturing and/or operation of an IC device like the IC device 200. For example, when indium is used to implement the TIM 360, a sufficiently high temperature (e.g., a temperature greater than 160 degrees Celsius) may melt the TIM 360 and generate hot air. Since the TIM 360 (along with the rest of the chip assembly 210) is encapsulated within a confined space, the hot air may increase the pressure within the confined space, and the melted TIM 360 may be pushed against the adhesive struc-tures 410. If the adhesive structures 410 are not sufficiently strong to withstand the pressure exerted by the TIM 360, they may at least partially collapse or break, which will then allow the TIM 360 to leak outside of the encapsulated space and come into contacts with other components, such as the passive components 300. This leads to unintended electrical shorting between the passive components 300 and the cir-cuitry inside the chip assembly 210, which is undesirable. The breakage of the adhesive structures 410 is exacerbated when the pressure built up inside the encapsulated space is so high, such that the melted TIM 360 may explode onto the adhesive structures 410, which makes the adhesive structure 410 more vulnerable for breaking. Furthermore, sometimes a package warpage may further weaken the adhesive struc-tures 410, which again increases the likelihood of breaking the adhesive structures 410.

To alleviate these problems discussed above, the present disclosure implements one or more openings, such as openings 500A-500D shown in FIG. 7, in the lid structure 450. These openings 500A-500D are unique physical characteristics of the lid structure 450. In more detail, the openings 500A-500D are sized and positioned to accommodate the thermal expansion of the TIM 360, which reduces the possibility of the TIM 360 breaking out of the adhesive structures 410. For example, the openings 500A-500D are communicatively coupled to the TIM 360, so that the TIM 360 may expand into the openings 500A-500D when needed. Stated differently, the openings 500A-500D expose the upper surfaces and/or the side surfaces of the TIM 360. When the TIM 360 undergoes thermal expansion, the path of least resistance is to expand into the spaces provided by the openings 500A-500D. As shown in FIG. 7, some portions of the TIM 360 have already expanded into the openings 500A-500D.

In some embodiments, the locations of the lid openings 500A-500D are configured such that they are vertically aligned with the non-heat-generating regions of the chip assembly 210. For example, the openings 500A and 500D are vertically aligned with the molding compound 250, and the openings 500B and 500C are vertically aligned with portions of the underfill material 260. This is configured so that the rest of the lid structure 450 (excluding the openings 500A-500D) should be positioned over (or aligned with) the heat-generating regions (e.g., the IC 230 or the electronic memory devices 240) of the chip assembly 210, as the lid structure 450 is metallic and helps dissipate the heat generated by the heat-generating regions of the chip assembly 210. Stated differently, had the openings 500A-500D been implemented to be vertically aligned with the heat-generating regions (as opposed to the non-heat-generating regions) of the chip assembly 210, that would have wasted portions of the lid structure 450 that could have been used to dissipate heat, thereby resulting in a sub-optimal heat dissipation performance. Here, by vertically aligning the openings 500A-500D, the present disclosure provides sufficient room to accommodate the expansion of the TIM 360 while preserving an optimal heat dissipation performance for the lid structure 450.

In the embodiment shown in FIG. 7, the openings 500A-500D are implemented as trenches that do not extend completely through the lid structure 450. For example, the openings 500A and 500B have depths D1 and D2, respectively, whereas a portion of the lid structure 450 in which the openings 500A-500B are formed has a depth D3 that is greater than the depth D1 or the depth D2. In that regard, the depth D1 is measured between a bottom surface 510 and a bottom surface 511, where the bottom surface 510 faces downward toward one of the passive components 300, and the bottom surface 511 faces downward toward the molding compound 250. The depth D2 is measured between a bottom surface 512 and a bottom surface 513. The bottom surface 512 is in direct physical contact with the plating layer 470 (or with the TIM 360 if the plating layer 470 had not been implemented). The bottom surface 513 exposes a portion of the TIM 360. The depth D3 is measured between the bottom surface 512 and an upper surface 514 of the lid structure 450. The fact that the depths D1 and D2 are each less than the depth D3 means that the TIM 360 may expand into the openings 500A-500D, but the TIM 360 will not escape out of the lid structure 450 in this embodiment.

It is understood that although the depths D1 and D2 are each less than the depth D3, the depths D1 and D2 may or may not be equal to one another. In some embodiments, the depths D1 and D2 may be implemented to have different values, depending on where the TIM 360 is likely to expand, as well as other design and fabrication concerns. Furthermore, the openings 500A-500D may have different lateral dimensions. For example, as shown in FIG. 7, the opening 500A has a width W1 measured in the X-direction, and the opening 500B has a width W2 measured in the X-direction. In some embodiments, the width W1 is greater than the width W2, or vice versa in some other embodiments. Again, the specific values of the widths W1 and W2 may be configured depending on where the TIM 360 is likely to expand, as well as other design and fabrication concerns.

Referring now to FIGS. 8A and 8B, the top view and cross-sectional side views of various portions of the IC device 200 are illustrated. In more detail, FIG. 8A illustrates a simplified top view of the IC device 200 without the lid structure 450 at a horizontal plane defined by the X-direction and a Y-direction, and FIG. 8B illustrates various cross-sectional side views of the lid structure 450 at a vertical plane defined by the X-direction and a Z-direction, where the cross-sectional side views are taken at various cutlines A-A', B-B', C-C', D-D', and E-E'. The location of the cutlines A-A', B-B', C-C', D-D', and E-E' are also shown in FIG. 8A in the top view.

As is shown in the top view of FIG. 8A, the IC 230 is surrounded by eight electronic memory devices 240. For example, four of the electronic memory devices 240 may be located to the left of the IC 230 in the X-direction, and another four of the electronic memory devices 240 may be located to the right of the IC 230 in the X-direction. In other embodiments, other number of electronic memory devices may be implemented, and some of the electronic memory devices may also be located beside the IC 230 in the Y-direction. Also shown in the top view of FIG. 8A is that the molding compound 250 circumferentially surrounds the IC 230 and the electronic memory devices 240 in 360 degrees. Different portions of the underfill material 260 are also disposed between the IC 230 and the electronic memory devices 240 in the X-direction, and between the electronic memory devices 240 in the Y-direction.

Still referring to FIG. 8A, the cutline A-A' is taken at a location corresponding to the substrate 220 (e.g., the PCB substrate to which the IC 230 and the electronic memory devices 240 are bonded). The cutline B-B' is taken at a location corresponding to portions of the substrate 220 and a portion of the molding compound 250. The cutline C-C' is taken at a location corresponding to portions of the substrate 220, portions of the molding compound 250, and a portion of the underfill 260. The cutline D-D' is taken at a location corresponding to portions of the substrate 220, portions of the molding compound 250, portions of the underfill 260, a subset of the electronic memory devices 240, and a portion of the IC 230. The cutline E-E' is taken at a location corresponding to portions of the substrate 220, portions of the molding compound 250, portions of the underfill material 260, and a portion of the IC 230.

As shown in the cross-sectional side views of FIG. 8B, the lid structure 450 exhibits different physical traits depending on where the cutline is taken. For example, at the cutline A-A', the lid structure 450 is a solid block and does not include an opening. At the cutline B-B', the lid structure 450 includes a portion of the opening 500 that is aligned with a portion of the molding compound 250. At the cutline C-C', the lid structure 450 includes a portion of the opening 500 that is aligned with portions of the molding compound 250 and the underfill material 260. At the cutline D-D', the lid structure 450 includes a portion of the opening 500 that is aligned with portions of the molding compound 250 and the underfill material 260. At the cutline E-E', the lid structure 450 includes a portion of the opening 500 that is aligned with portions of the molding compound 250 and the underfill material 260.

Regardless of the specific geometries and/or locations of the openings 500 shown in FIG. 8B, it is understood that they expose, or are communicatively coupled to, the TIM 360 discussed above, such that they can accommodate the TIM 360 when the TIM 360 thermally expands. Since the thermally-expanded TIM 360 can be accommodated partially within the openings 500, less pressure (if any at all) will be applied against the adhesive structures 410 serving as dams. As such, leakage of the TIM 360 is less likely to occur.

Figure 9:
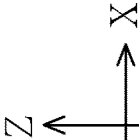
FIG. 9 illustrates a cross-sectional side views of an IC device at a stage of fabrication according to embodiments of the present disclosure.
Figure 10B:
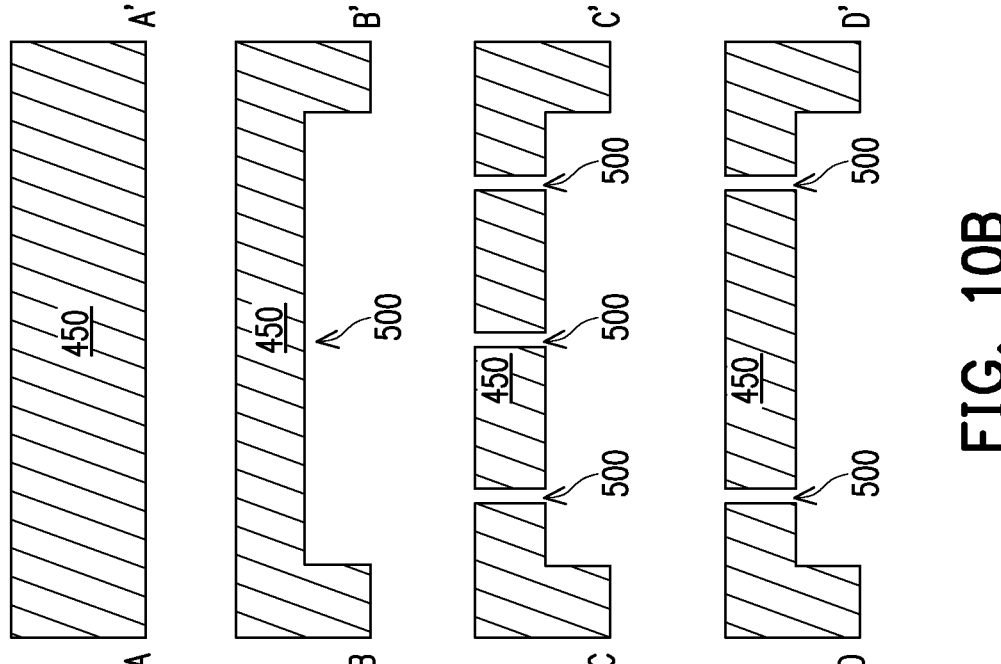
FIG. 10B illustrates various cross-sectional side views of a lid structure according to embodiments of the present disclosure.
Figure 10A:
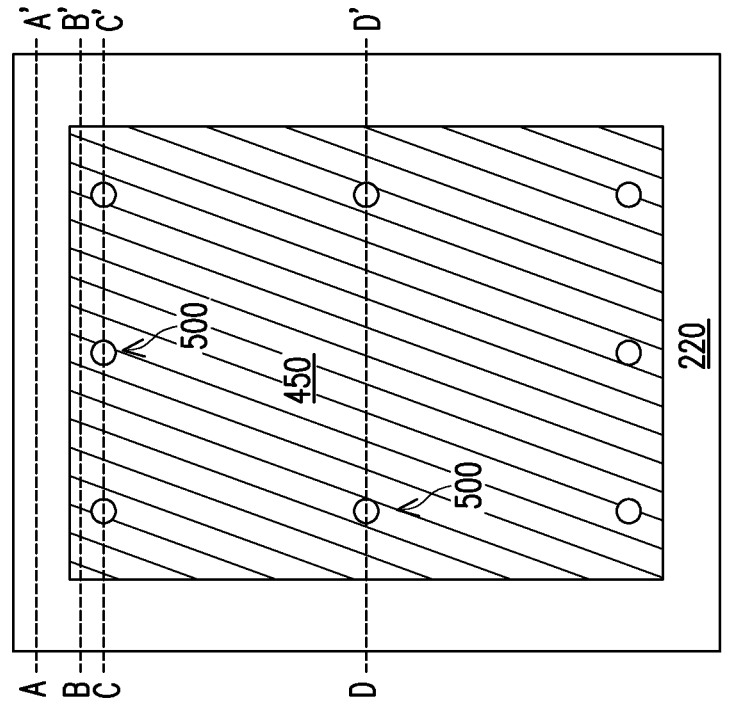
FIG. 10A illustrates a top view of a lid structure according to embodiments of the present disclosure.

Referring now to FIG. 9, an alternative embodiment of the lid structure 450 is illustrated. For reasons of consistency and clarity, similar elements appearing in FIGS. 7 and 9 will be labeled the same. As shown in FIG. 9, the lid attachment process 440 still attaches the lid structure 450 to the substrate 220 and to the chip assembly 210. The lid structure 450 in FIG. 9 also includes one or more openings to accommodate the thermal expansion of the TIM 360, such as the openings 500E and 500F. However, unlike the embodiment of FIG. 7, where the openings 500 are trenches and do not extend completely through the lid structure 450 vertically, the openings 500E and 500F in the embodiment of FIG. 9 are holes that do extend completely through the lid structure 450 vertically. In other words, the openings 500E and 500F expose the components thereunder to elements (e.g., air) outside the IC device 200. As such, if any leakage of the TIM 360 occurs, the TIM 360 may leak out of the openings 500E and 500F, but it will not come into direct contact with the passive components 300. In this manner, the undesirable electrical shorting discussed above may still be prevented.

FIGS. 10A and 10B illustrate the top view and cross-sectional side views of various portions of the IC device 200 corresponding to the embodiment of the lid structure 450 of FIG. 9. Again, for reasons of consistency and clarity, similar elements appearing in FIGS. 8A-8B and 10A-10B will be labeled the same. Similar to FIG. 8A, the top view of FIG. 10A also illustrates a plurality of cutlines A-A', B-B', C-C', D-D', whose corresponding cross-sectional side views of the lid structure 450 are illustrated in FIG. 10B. However, FIG. 10A does not illustrate the IC 230 or the electronic memory devices 240. Instead, FIG. 10A illustrates the top view of the lid structure 450 itself, along with the openings 500 (e.g., in the form of holes) formed in the lid structure 450. The openings 500 are also clearly visible in the cross-sectional side views corresponding to the cutlines C-C' and D-D'. As discussed above, these openings 500 may partially accommodate the TIM 360 and/or allow the TIM 360 to escape therethrough, which reduces the likelihood of electrical shorting.

FIGS. 2-7 and 9 illustrate the cross-sectional side views of the IC device 200 at different stages of fabrication according to a first process flow of the present disclosure. FIGS. 11-15 illustrate the cross-sectional side views of the IC device 200 at different stages of fabrication according to a second process flow of the present disclosure. Again, for reasons of consistency and clarity, similar elements appearing in FIGS. 2-7, 9, and 11-15 will be labeled the same.

Figure 11:
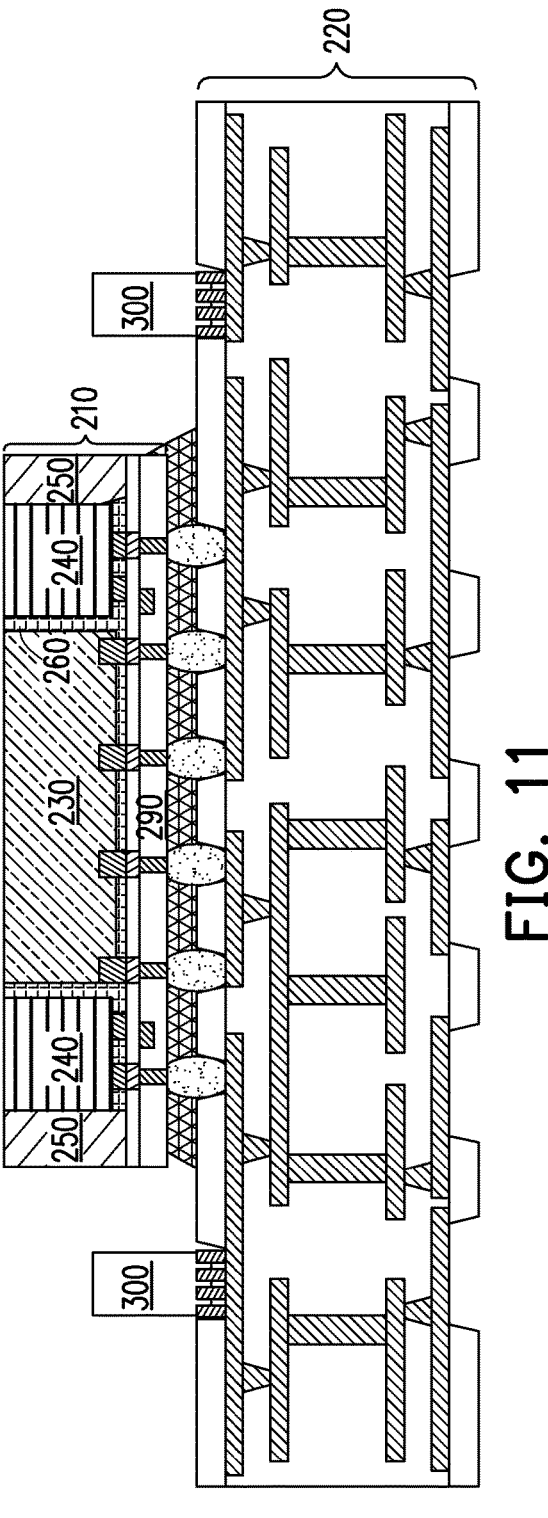

Referring now to FIG. 11, the IC device 200 at this stage of fabrication is similar to the IC device 200 shown in FIG. 2. For example, the chip assembly 210—which includes the IC 230 and the electronic memory devices 240—is bonded to the substrate 220, and the passive components 300 are attached to the substrate 220. The molding compound 250 and the underfill material 260 are also formed and cured. However, unlike FIG. 2, no back side metal layer 280 is formed on the chip assembly 210 in the IC device 200 of FIG. 11.

Figure 12:
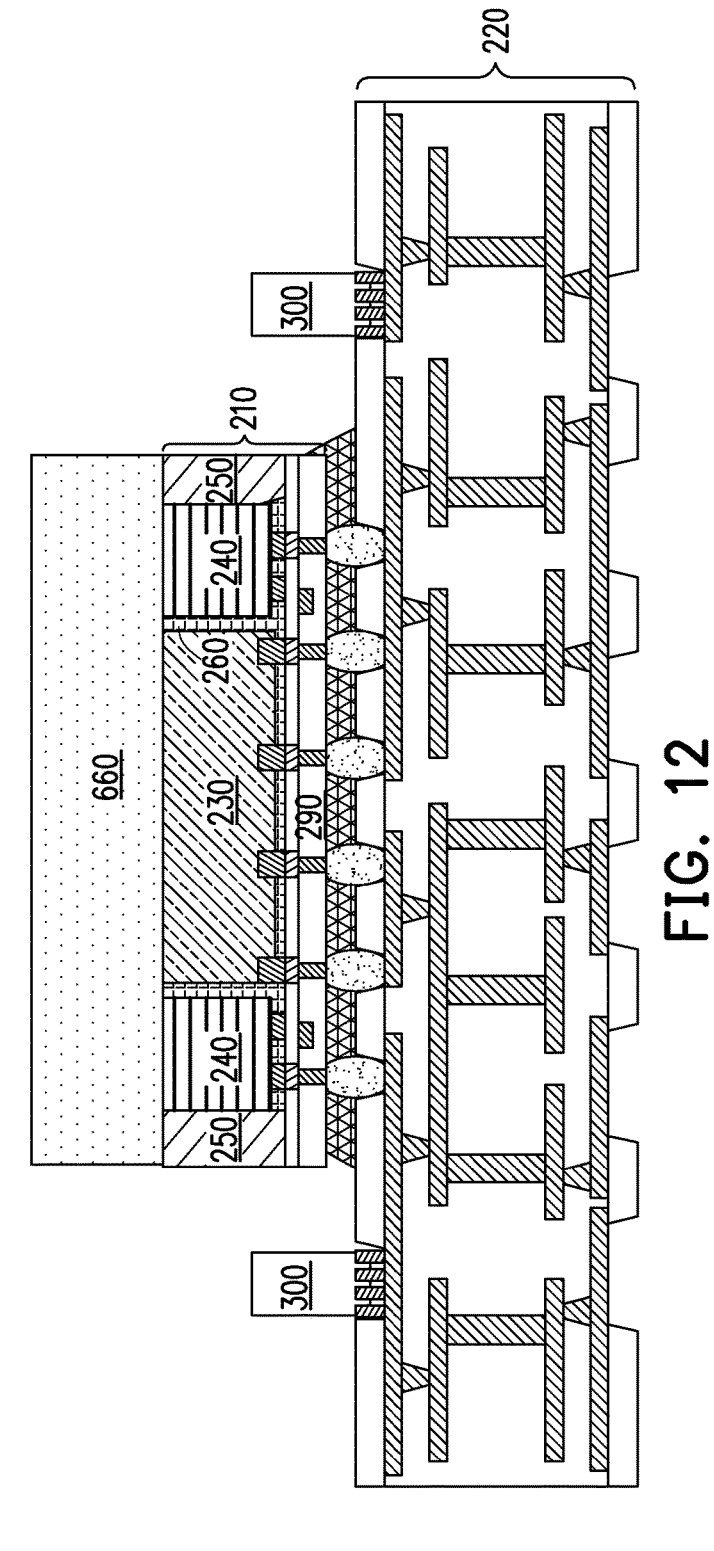

Referring now to FIG. 12, a TIM application process 650 is performed to apply a TIM 660 over the chip assembly 210. Unlike the first process flow, no flux material needs to be formed before the TIM application process 650. This is at least in part due to the different material compositions between the TIM 660 and the TIM 360. Whereas the TIM 360 of the first process flow includes indium or an indium alloy, the TIM 660 of the second process flow includes a phase change metal (PCM) material. In some embodiments, the PCM material include an alloy that contains bismuth (Bi), indium (In), and tin (Sn). Due to the absence of the flux material, the TIM 660 may be formed to be in direct contact with the upper surface of the chip assembly 210.

Figure 13:
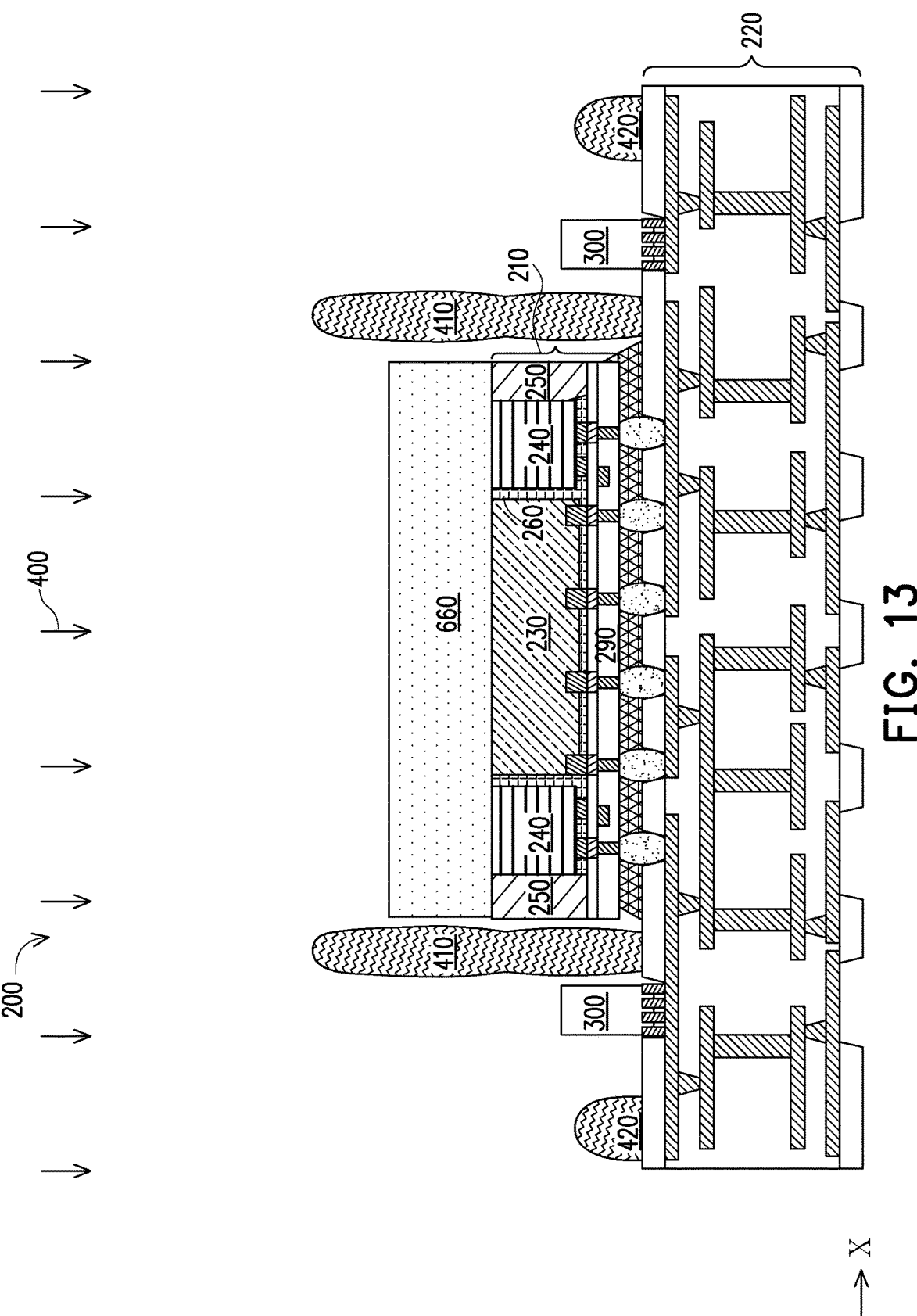

Referring now to FIG. 13, the adhesive dispensing process 400 discussed above is performed to form the adhesive structures 410 and 420. As is in the first process flow, the adhesive structures 410 in the second process flow are formed adjacent to the chip assembly 210, and the adhesive structures 420 are formed farther away from the chip assembly 210. The adhesive structures 410 may serve as dam structures to prevent leakage of the TIM 660.

Figure 14:
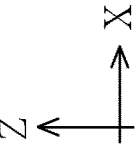

Referring now to FIG. 14, the lid attachment process 440 is performed to attach the lid structure 450 to the substrate 220 and to the chip assembly 210. The lid structure 450 of FIG. 14 may be substantially similar to the lid structure 450 of FIG. 7. For example, the lid structure 450 may include the openings 500A-500D (e.g., in the form of trenches) that extend partially into (but not completely through) the lid structure 450. Again, the design of the lid structure 450 allows the TIM 660 to expand into the openings 500A-500D, which alleviates the TIM leakage problem discussed above.

Figure 15:
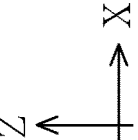

Referring now to FIG. 15, the alternative embodiment of the lid structure 450 (i.e., the embodiment discussed above with reference to FIG. 9) may also be attached to the substrate 220 and to the chip assembly 210 via the lid attachment process 440. As discussed above, the alternative embodiment of the lid structure 450 has openings 500E and 500F in the form of holes that extend completely through the lid structure 450. The openings 500E-500F accommodate the expansion of the TIM 660 in volume, which reduces the likelihood of the TIM 660 breaking through the adhesive structures 410.

FIGS. 16-20 illustrate the cross-sectional side views of the IC device 200 at different stages of fabrication according to a third process flow of the present disclosure. Again, for reasons of consistency and clarity, similar elements appearing in FIGS. 2-7, 9, 11-15, and 16-20 will be labeled the same.

Figure 16:
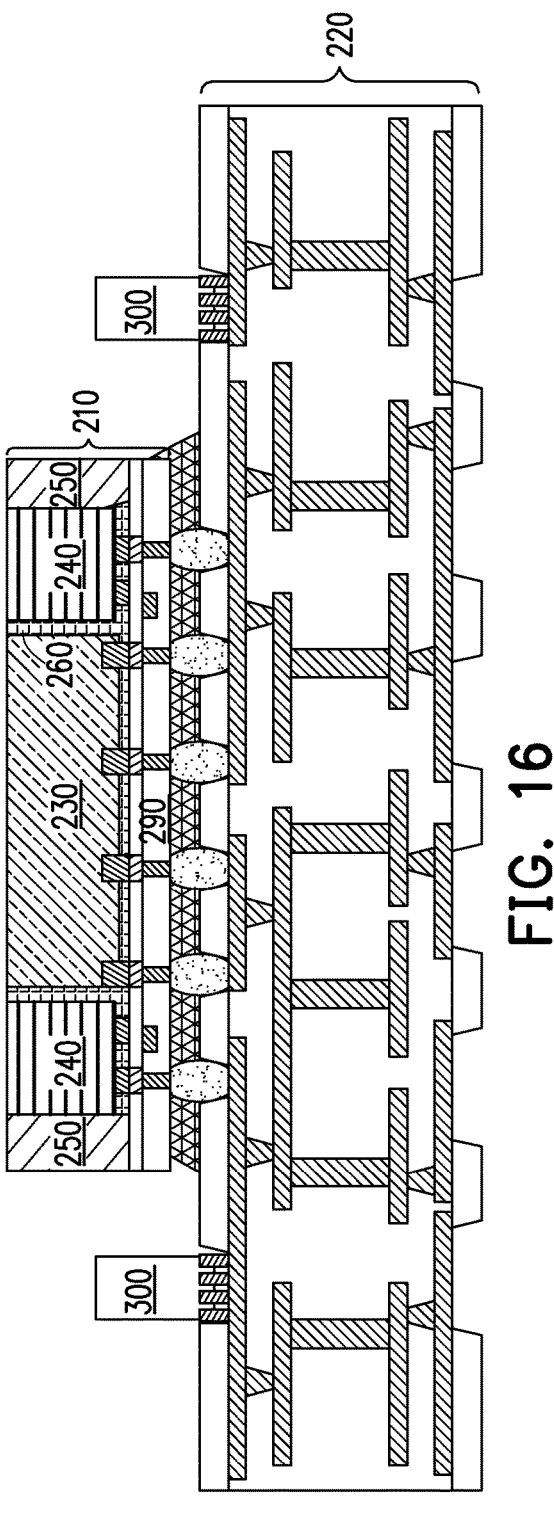

Referring now to FIG. 16, the IC device 200 at this stage of fabrication is similar to the IC device 200 shown in FIG. 2. For example, the chip assembly 210—which includes the IC 230 and the electronic memory devices 240—is bonded to the substrate 220, and the passive components 300 are attached to the substrate 220. The molding compound 250 and the underfill material 260 are also formed and cured. However, unlike FIG. 2, no back side metal layer 280 is formed on the chip assembly 210 in the IC device 200 of FIG. 11.

Referring now to FIG. 17, a TIM application process 750 is performed to apply a TIM 760 over the chip assembly 210. In some embodiments, the TIM application process 750 includes a liquid metal dispensing process. The liquid metal dispensing process dispenses a plurality of liquid metal balls as the TIM 760. In some embodiments, the liquid metal balls may include a gallium alloy. Again, no flux material needs to be applied onto the upper surface of the chip assembly 210 before the liquid metal balls are dispensed. Due to the absence of the flux material, the TIM 760 may be formed to be in direct contact with the upper surface of the chip assembly 210 in this embodiment.

Figure 18:
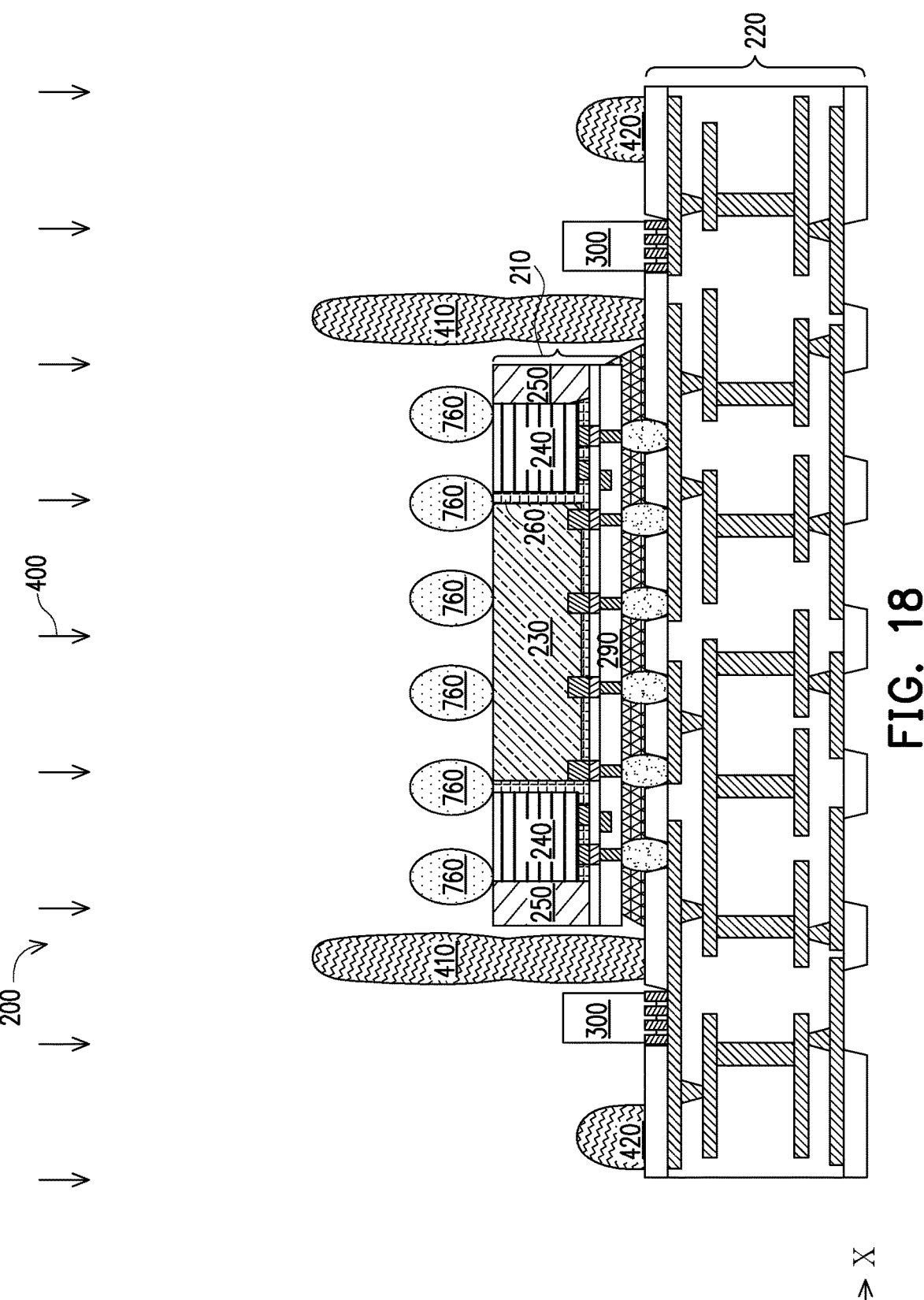

Referring now to FIG. 18, the adhesive dispensing process 400 discussed above is performed to form the adhesive structures 410 and 420. As is in the first and second process flows, the adhesive structures 410 in the third process flow are formed adjacent to the chip assembly 210, and the adhesive structures 420 are formed farther away from the chip assembly 210. The adhesive structures 410 may serve as dam structures to prevent leakage of the TIM 660.

Figure 19:
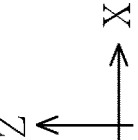

Referring now to FIG. 19, the lid attachment process 440 is performed to attach the lid structure 450 to the substrate 220 and to the chip assembly 210. The lid structure 450 of FIG. 19 may be substantially similar to the lid structure 450 of FIG. 7. For example, the lid structure 450 may include the openings 500A-500D (e.g., in the form of trenches) that extend partially into (but not completely through) the lid structure 450. Again, the design of the lid structure 450 allows the TIM 760 to expand into the openings 500A-500D, which alleviates the TIM leakage problem discussed above. Also note that the liquid metal balls of the TIM 760 have merged with one another to form a single layer as the TIM 760 at this stage of fabrication.

Figure 20:
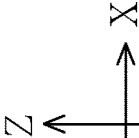
Figure 21:
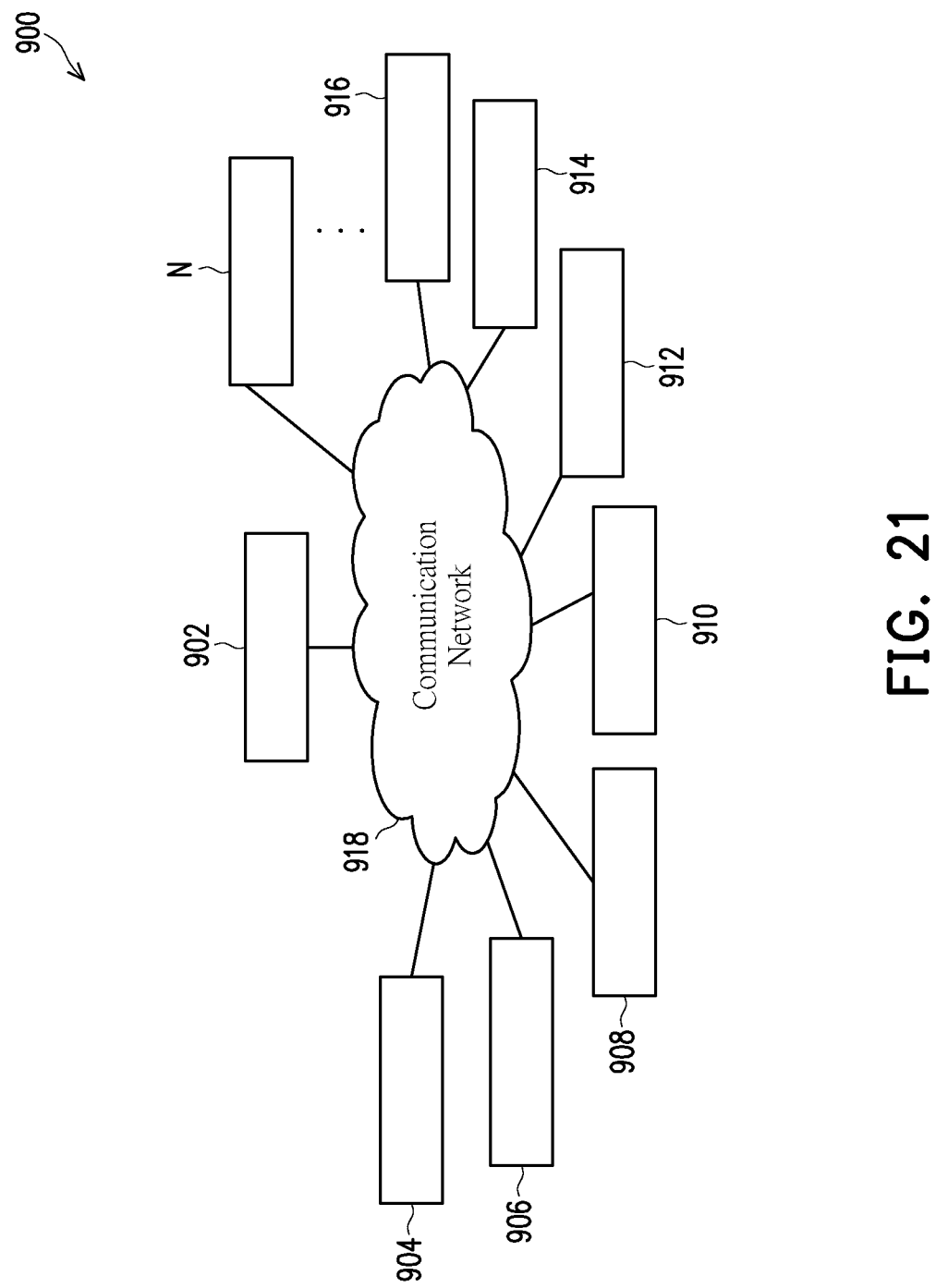
FIG. 21 illustrates an integrated circuit fabrication system according to various aspects of the present disclosure.

Referring now to FIG. 20, the alternative embodiment of the lid structure 450 (i.e., the embodiment discussed above with reference to FIG. 9) may also be attached to the substrate 220 and to the chip assembly 210 via the lid attachment process 440. As discussed above, the alternative embodiment of the lid structure 450 has openings 500E and 500F in the form of holes that extend completely through the lid structure 450. The openings 500E-500F accommodate the expansion of the TIM 760 in volume, which reduces the likelihood of the TIM 660 breaking through the adhesive structures 410.

FIG. 21 illustrates an integrated circuit fabrication system 900 according to embodiments of the present disclosure. The fabrication system 900 includes a plurality of entities 902, 904, 906, 908, 910, 912, 914, 916 . . . , N that are connected by a communications network 918. The network 918 may be a single network or may be a variety of different networks, such as an intranet and the Internet, and may include both wire line and wireless communication channels.

In an embodiment, the entity 902 represents a service system for manufacturing collaboration; the entity 904 represents an user, such as product engineer monitoring the interested products; the entity 906 represents an engineer, such as a processing engineer to control process and the relevant recipes, or an equipment engineer to monitor or tune the conditions and setting of the processing tools; the entity 908 represents a metrology tool for IC testing and measurement; the entity 910 represents a semiconductor processing tool, such the processing tools to perform the various deposition processes discussed above; the entity 912 represents a virtual metrology module associated with the processing tool 910; the entity 914 represents an advanced processing control module associated with the processing tool 910 and additionally other processing tools; and the entity 916 represents a sampling module associated with the processing tool 910.

Each entity may interact with other entities and may provide integrated circuit fabrication, processing control, and/or calculating capability to and/or receive such capabilities from the other entities. Each entity may also include one or more computer systems for performing calculations and carrying out automations. For example, the advanced processing control module of the entity 914 may include a plurality of computer hardware having software instructions encoded therein. The computer hardware may include hard drives, flash drives, CD-ROMs, RAM memory, display devices (e.g., monitors), input/output device (e.g., mouse and keyboard). The software instructions may be written in any suitable programming language and may be designed to carry out specific tasks.

The integrated circuit fabrication system 900 enables interaction among the entities for the purpose of integrated circuit (IC) manufacturing, as well as the advanced processing control of the IC manufacturing. In an embodiment, the advanced processing control includes adjusting the processing conditions, settings, and/or recipes of one processing tool applicable to the relevant wafers according to the metrology results.

In another embodiment, the metrology results are measured from a subset of processed wafers according to an optimal sampling rate determined based on the process quality and/or product quality. In yet another embodiment, the metrology results are measured from chosen fields and points of the subset of processed wafers according to an optimal sampling field/point determined based on various characteristics of the process quality and/or product quality.

One of the capabilities provided by the IC fabrication system 900 may enable collaboration and information access in such areas as design, engineering, and processing, metrology, and advanced processing control. Another capability provided by the IC fabrication system 900 may integrate systems between facilities, such as between the metrology tool and the processing tool. Such integration enables facilities to coordinate their activities. For example, integrating the metrology tool and the processing tool may enable manufacturing information to be incorporated more efficiently into the fabrication process or the APC module, and may enable wafer data from the online or in site measurement with the metrology tool integrated in the associated processing tool.

Based on the above discussions, it can be seen that the present disclosure implements a unique lid structure over a chip assembly to prevent or reduce the potential leakage of a TIM disposed over the chip assembly. For example, the lid structure includes one or more openings in the form of trenches or holes that are communicatively coupled to the TIM. Such a lid structure offers advantages over other devices. It is understood, however, that no particular advantage is required, other embodiments may offer different advantages, and that not all advantages are necessarily disclosed herein. One advantage is the reduction of TIM leakage. In more detail, the TIM formed over the chip assembly may undergo a volume expansion when certain conditions are met (e.g., temperature exceeding a predefined threshold). Such a volume expansion of the TIM may cause the TIM to break open an adjacent dam structure (e.g., an adhesive dam) and leak onto microelectronic components, such as discrete passive components that were previously separated from the chip assembly by the dam structure. When this occurs, undesirable electrical shorting may occur between the chip assembly and the nearby microelectronic components. Here, the openings of the lid structure provide ample space for the TIM to expand into. In other words, even when the TIM undergoes volume expansion, the path of least resistance is to flow into the openings of the lid structure, rather than exerting pressure against the dam structures. Accordingly, the TIM is unlikely to break open the dam structure and leak onto the nearby microelectronic components, which in turn prevents or reduces the undesirable electrical shorting. Other advantages may include ease of fabrication and compatibility with existing fabrication processes.

The advanced lithography process, method, and materials described above can be used in many applications, including in IC devices using fin-type field effect transistors (Fin-FETs). For example, the fins may be patterned to produce a relatively close spacing between features, for which the above disclosure is well suited. In addition, spacers used in forming fins of FinFETs, also referred to as mandrels, can be processed according to the above disclosure. It is also understood that the various aspects of the present disclosure discussed above may apply to multi-channel devices such as Gate-All-Around (GAA) devices. To the extent that the present disclosure refers to a fin structure or FinFET devices, such discussions may apply equally to the GAA devices.

One aspect of the present disclosure pertains to a device. The device includes a substrate. The device includes a chip assembly disposed over the substrate. The device includes a thermal interface material (TIM) disposed over the chip assembly. The device includes an adhesive dam disposed over the substrate. The adhesive dam surrounds the chip assembly and the TIM laterally. The device includes a lid structure disposed over the substrate and encapsulating the chip assembly therein. The lid structure includes one or more openings that expose portions of the TIM.

Another aspect of the present disclosure pertains to a device. The device includes a printed circuit board (PCB) substrate. The device includes a chip assembly disposed over the PCB substrate in a cross-sectional side view. The chip assembly includes an integrated circuit (IC), a plurality of electronic memory devices coupled to the IC, and one or more non-heat-generating regions that encircle the IC and the electronic memory devices collectively in a top view. The device includes a thermal interface material (TIM) disposed over the chip assembly in the cross-sectional side view. The TIM is configured to expand when heated. The device includes an adhesive structure disposed over the substrate in the cross-sectional side view. The adhesive structure surrounds the chip assembly and the TIM in the top view. The device includes a metallic lid disposed over the substrate, the TIM, and the adhesive structure in the cross-sectional side view. The device includes one or more openings that are vertically aligned with the one or more non-heat-generating regions, respectively. The one or more openings are configured to accommodate a thermally-expanded TIM.

Yet another aspect of the present disclosure pertains to a method. A chip assembly is bonded to a substrate. The chip assembly includes an integrated circuit (IC), a plurality of electronic memory devices coupled to the IC, and a molding compound material that surrounds the IC and the electronic memory devices in a top view. A thermal interface material (TIM) is applied over the chip assembly. An adhesive material is dispensed over the substrate. The adhesive material laterally surrounds the chip assembly and the TIM. A lid structure is attached to the substrate, the lid structure encapsulating the chip assembly thereunder. The lid structure includes one or more openings that are communicatively coupled to the TIM.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A device, comprising:
a substrate;
a chip assembly disposed over the substrate;
a thermal interface material (TIM) disposed over the chip assembly;
an adhesive dam disposed over the substrate, wherein the adhesive dam surrounds the chip assembly and the TIM laterally; and
a lid structure disposed over the substrate and encapsulating the chip assembly therein, wherein the lid structure includes one or more openings that expose portions of the TIM, and wherein at least some of the openings expose side surfaces of the adhesive dam.

2. The device of claim 1, wherein the chip assembly includes:
an integrated circuit (IC);
a plurality of electronic memory devices coupled to the IC, the electronic memory devices disposed on opposite sides of the IC in a top view; and
a molding compound material that circumferentially surrounds the IC and the electronic memory devices collectively in the top view, wherein at least a first subset of the one or more openings is vertically aligned with the molding compound material.

3. The device of claim 2, wherein:
the chip assembly further includes an underfill material disposed between the IC and the electronic memory devices; and
a second subset of the one or more openings is vertically aligned with the underfill material.

4. The device of claim 1, wherein the one or more openings include trenches that vertically extend partially into the lid structure.

5. The device of claim 1, wherein the one or more openings vertically extend completely through the lid structure.

6. The device of claim 1, wherein the portions of the TIM protrude at least partially into the one or more openings.

7. The device of claim 1, wherein at least some of the openings expose side surfaces of the adhesive dam.

8. The device of claim 1, wherein a bottom surface of a portion of the lid structure is in direct physical contact with an upper surface of the TIM.

9. The device of claim 1, wherein:
the substrate includes a plurality of metal lines and vias;
the TIM includes an indium alloy, a gallium alloy, or an alloy that contains bismuth, indium, and tin; and
the lid structure contains copper, nickel, gold, or silver.

10. A device, comprising:
a printed circuit board (PCB) substrate;
a chip assembly disposed over the PCB substrate in a cross-sectional side view, wherein the chip assembly includes an integrated circuit (IC), a plurality of electronic memory devices coupled to the IC, and one or more non-heat-generating regions that encircle the IC and the electronic memory devices collectively in a top view;

a thermal interface material (TIM) disposed over the chip assembly in the cross-sectional side view, wherein the TIM is configured to expand when heated;

an adhesive structure disposed over the substrate in the cross-sectional side view, wherein the adhesive structure surrounds the chip assembly and the TIM in the top view, and wherein the adhesive structure has a greater vertical dimension than the chip assembly in the cross-sectional side view;

a metallic lid disposed over the substrate, the TIM, and the adhesive structure in the cross-sectional side view; and one or more openings that are vertically aligned with the one or more non-heat-generating regions, respectively, wherein the one or more openings are configured to accommodate a thermally-expanded TIM.

11. The device of claim 10, wherein the one or more openings include trenches that extend partially into the metallic lid.

12. The device of claim 10, wherein the one or more openings include holes that extend completely through the metallic lid vertically.

13. The device of claim 10, wherein:

the one or more non-heat-generating regions include a first region that contains a molding compound and a second region that contains an underfill material;

the first region encircles the electronic memory devices and the IC collectively in the top view;

the second region is disposed between the electronic memory devices and the IC; and the one or more openings include a first opening that is vertically aligned with the first region and a second opening that is vertically aligned with the second region.

14. A device, comprising:

a substrate that includes a plurality of metal lines and vias;

a chip assembly disposed over the substrate in a vertical direction in a cross-sectional side view, wherein the chip assembly includes:

an integrated circuit (IC) device; and a plurality of electronic memory devices electrically coupled to the IC, the electronic memory devices disposed on opposite sides of the IC in a horizontal direction in the cross-sectional side view;

a thermal interface material (TIM) disposed over the chip assembly in the vertical direction in the cross-sectional side view, wherein the TIM includes an indium alloy, a gallium alloy, or an alloy that contains bismuth, indium, and tin;

an adhesive dam disposed over the substrate in the vertical direction in the cross-sectional side view, wherein the adhesive dam surrounds the chip assembly and the TIM laterally in the cross-sectional side view, and wherein the adhesive dam is separated from the TIM; and a metallic lid structure disposed over the substrate and encapsulating the chip assembly therein in the cross-sectional side view, wherein the metallic lid structure includes one or more openings that extend vertically partially into the metallic lid structure and expose portions of the TIM, and wherein the metallic lid structure contains copper, nickel, gold, or silver.

15. The device of claim 14, wherein the chip assembly further includes a molding compound material that circumferentially surrounds the IC device and the electronic memory devices collectively in a planar top view.

16. The device of claim 15, wherein at least some of the openings are vertically aligned with the molding compound material.

17. The device of claim 15, wherein:

the chip assembly further includes an underfill material disposed between the IC and the electronic memory devices in the cross-sectional side view; and the metallic lid structure includes one or more further openings vertically aligned with the underfill material.

18. The device of claim 14, wherein at least one of the openings extend vertically completely through the metallic lid structure in the cross-sectional side view.

19. The device of claim 14, wherein the portions of the TIM protrude at least partially into the one or more openings.

20. The device of claim 14, wherein a bottom surface of a portion of the metallic lid structure borders an upper surface of the TIM.

* * * * *